(12) United States Patent  
Baier et al.

(10) Patent No.: US 9,397,476 B2
(45) Date of Patent: Jul. 19, 2016

(54) LASER SENSOR FOR SELF-MIXING INTERFEROMETRY HAVING A VERTICAL EXTERNAL CAVITY SURFACE EMISSION LASER (VECSEL) AS THE LIGHT SOURCE

(75) Inventors: Johannes Baier, Wuerselen (DE); Holger Moench, Vaals (NL)

(73) Assignee: Koninklijke Philips N.V., Eindhoven (NL)

( * ) Notice: Subject to any disclaimer, the term of this patent is extended or adjusted under 35 U.S.C. 154(b) by 328 days.

(21) Appl. No.: 12/598,218

(22) PCT Filed: Apr. 29, 2008

(86) PCT No.: PCT/IB2008/051648
§ 371 (c)(1),
(2), (4) Date: Oct. 30, 2009

(87) PCT Pub. No.: WO2008/135903
PCT Pub. Date: Nov. 13, 2008

(65) Prior Publication Data
US 2010/0134803 A1    Jun. 3, 2010

(30) Foreign Application Priority Data

May 7, 2007    (EP) .................................... 07107653

(51) Int. Cl.
| | |
|---|---|
| *G01B 9/02* | (2006.01) |
| *H01S 5/14* | (2006.01) |
| *H01S 5/026* | (2006.01) |
| *H01S 5/183* | (2006.01) |

(52) U.S. Cl.
CPC ............ *H01S 5/141* (2013.01); *G01B 9/02092* (2013.01); *H01S 5/0262* (2013.01); *H01S 5/142* (2013.01); *H01S 5/183* (2013.01)

(58) Field of Classification Search
CPC ........................ G01B 9/02002; G01B 9/02092
USPC .......................... 356/454, 498, 450; 372/50.1
See application file for complete search history.

(56) References Cited

U.S. PATENT DOCUMENTS

| | | | |
|---|---|---|---|
| 5,594,543 A | 1/1997 | de Groot et al. | |
| 5,838,439 A * | 11/1998 | Zang et al. .................... | 356/484 |
| 6,507,593 B1 * | 1/2003 | Spinelli et al. ................. | 372/20 |
| 6,836,578 B2 | 12/2004 | Kochergin et al. | |
| 7,106,451 B2 * | 9/2006 | Zhang et al. .................. | 356/487 |
| 7,539,227 B2 | 5/2009 | Kim | |
| 7,619,744 B2 * | 11/2009 | Liess ............................. | 356/498 |
| 2006/0140235 A1 | 6/2006 | Kim | |
| 2006/0193356 A1 | 8/2006 | Osiander et al. | |
| 2006/0215713 A1 | 9/2006 | Flanders et al. | |
| 2007/0053402 A1 | 3/2007 | Braunecker | |

FOREIGN PATENT DOCUMENTS

| | | |
|---|---|---|
| EP | 1645837 A1 | 4/2006 |
| JP | 8094314 A | 4/1996 |
| JP | 8136216 A | 5/1996 |

(Continued)

*Primary Examiner* — Hwa Lee

(57) ABSTRACT

The present invention relates to a laser sensor for self-mixing interferometry. The laser sensor comprises at least one semiconductor laser light source emitting laser radiation and at least one photodetector (6) monitoring the laser radiation of the laser light source. The laser light source is a VECSEL having a gain medium (3) arranged in a layer structure (15) on a front side of a first end mirror (4), said first end mirror (4) forming an external cavity with an external second end mirror (5). The proposed laser sensor provides an increased detection range and can be manufactured in a low-cost production process.

11 Claims, 3 Drawing Sheets

(56) References Cited

FOREIGN PATENT DOCUMENTS

| JP | 2006322911 A | 11/2006 |
|---|---|---|
| JP | 2006343712 A | 12/2006 |
| WO | 9856087 A1 | 12/1998 |
| WO | 2004064211 A1 | 7/2004 |
| WO | 2005106614 A2 | 11/2005 |
| WO | 2006087650 A2 | 8/2006 |
| WO | 2007125452 A2 | 11/2007 |

* cited by examiner

LASER SENSOR FOR SELF-MIXING INTERFEROMETRY HAVING A VERTICAL EXTERNAL CAVITY SURFACE EMISSION LASER (VECSEL) AS THE LIGHT SOURCE

FIELD OF THE INVENTION

The present invention relates to a laser sensor for self-mixing interferometry, comprising at least one semiconductor laser light source emitting laser radiation and at least one photodetector monitoring the laser radiation of the laser light source.

Laser sensors based on self-mixing interferometry (SMI) provide the possibility of measuring velocities, vibrations and distances and thus cover a wide range of applications. SMI laser sensors make use of the effect that laser light, which is scattered back from a target object and re-enters the laser cavity, interferes with the resonating radiation and thus influences the output properties of the laser. When the laser is operated not too far above the laser threshold, the response to the back-coupled light is linear, and the resulting output power or frequency variations contain traceable information on the movement or distance of the target object with respect to the sensor. The laser output signal, which contains the information, is collected via a photodetector.

BACKGROUND OF THE INVENTION

Semiconductor lasers are frequently used as laser light sources in SMI laser sensors. If these lasers are operated with a defined current shape, for example, a periodic sawtooth or triangular current, the output frequency of the laser almost instantaneously follows these current variations due to the simultaneously changed optical resonator length. The resulting difference in frequency between the resonating and the back-scattered light can be evaluated in a suitable evaluation unit and translated back to the desired position or velocity information.

Infrared vertical cavity surface-emitting lasers (VCSEL) are quite common in optical communication applications. The laser cavity consists of two stacks of Distributed Bragg Reflectors (DBRs), which are epitaxially grown on a suitable substrate and enclose a gain region made up of several quantum wells. The DBR layers also take over the task of feeding current into the gain region. Therefore, one of the DBRs is usually n-doped and the other p-doped. In such a VCSEL, one of the DBRs is designed to be highly reflective, typically the p-DBR with a reflectivity of >99.9% for the lasing wavelengths, while the other one allows efficient outcoupling of the laser radiation and thus also feedback from the target object into the laser cavity. VCSELs have the great advantage that their surface-emitting properties render them suitable for production and testing on a wafer level in large quantities, which opens the possibility of a low-cost production process. Furthermore, the output power can be scaled to a certain extent via the area of the emitting surface. Larger output powers can be achieved by using VCSEL arrays.

A known laser sensor based on self-mixing interferometry and comprising a VCSEL as the laser light source is the Laser Beetle of Philips. This laser sensor is used as a motion sensor in PC laser mice. The VCSEL emits infrared light around 1 µm wavelength with a typical output power of a few milliwatts. Due to the short coherence length of the VCSEL and the low output power density, the detection range of this sensor is limited to several millimeters. This short detection range is a main drawback of laser sensors with VCSELs as laser light sources. Since the sensing principle of an SMI laser sensor makes use of the interference between the resonating and back-scattered radiation, the maximally accessible range of such a device is limited to half the coherence length $l_c$ of the laser radiation, which is approximated by $$l_c \approx \frac{\lambda_0^2}{\Delta\lambda_{FWHM}},$$

wherein $\lambda_0$ is the center wavelength of the laser radiation and $\Delta\lambda_{FWHM}$ is its spectral line width (full width at half maximum). Estimating the coherence length of existing VCSEL-based SMI sensors from a typical center wavelength of ~1 µm and an emission half width of ~0.2 nm, a value of $l_c \approx 5$ mm is obtained, which is well in line with the detection range of existing devices. However, the short detection range limits the application of such VCSEL-based SMI laser sensors to short-range applications.

OBJECT AND SUMMARY OF THE INVENTION

It is an object of the present invention to provide an SMI laser sensor based on a semiconductor laser light source which exceeds the detection range of VCSEL-based SMI laser sensors and can still be manufactured in a low-cost production process.

This object is achieved with the SMI laser sensor as defined in claim 1. Advantageous embodiments of this laser sensor are subject matter of the dependent claims or are described in the subsequent parts of the description.

The proposed SMI laser sensor comprises at least one semiconductor laser light source emitting laser radiation, preferably modulated in frequency, and at least one photodetector monitoring or sensing the laser radiation of the laser light source. The laser sensor is characterized in that the laser light source is a vertical external cavity surface emission laser (VECSEL) having a gain medium arranged in a layer structure on a front side of a first end mirror, said first end mirror forming an external cavity with an external second end mirror. In such a VECSEL, the length of the external cavity affects the coherence length of the emitted laser radiation. A sensor control unit is designed to operate the VECSEL in such a way that lasing occurs only between the first and second end mirrors.

Due to the external cavity, the coherence length of the laser light source is significantly increased with respect to a VCSEL. The coherence length of the laser radiation is directly related to the cavity length of the laser resonator via its half width $\Delta\lambda_{FWHM}$. For a Fabry-Perot cavity, for example, the line width is determined by $$\Delta\lambda_{FWHM} = \frac{\Delta\lambda_{FSR}}{F},$$

wherein F is the Finesse of the laser cavity, which depends on the reflectivity of the defining laser mirrors, and $\Delta\lambda_{FSR}$ is the free spectral range, i.e. the wavelength spacing between two adjacent longitudinal cavity modes. The free spectral range depends on the cavity length D via the relation $$\Delta\lambda_{FSR} \approx \frac{\lambda_0^2}{2 \cdot D}.$$

Combining this relation with the above relation for the coherence length $l_c$ yields $l_c \approx 2 \cdot F \cdot D.$ It is obvious that, for constant reflection properties of the laser cavity, the coherence length $l_c$ of the emitted radiation is proportional to the cavity length D.

The increased cavity length of a VECSEL results in a significant increase of the coherence length $l_c$ and an increased power density as compared with a VCSEL. Consequently, the operating or detection range of the SMI laser sensor increases in the same proportion. As compared with the cavity length of a VCSEL, which is of the order of around 10 μm, the cavity length of a VECSEL according to the present invention is >1 mm. This results in a considerable extension of the working range of the SMI laser sensor to several meters, which would allow replacement of more expensive technologies such as, for example, short-range RADAR and also provides the possibility of widespread use of such sensors in the field of automotive applications (e.g. parking aids, blind-angle supervision, . . . ) or motion detection.

Since the VECSEL is based on a VCSEL construction, such a laser sensor can nevertheless be produced in a similar manner in a low-cost production process. The increased effective cavity length also improves the beam quality and thus facilitates the collimation of the sensing laser beam at large distances.

By virtue of its construction, a VECSEL allows wavelength scanning or wavelength tuning of the laser radiation, which is necessary for distance measuring, by varying the length of the external cavity via a movement of the external mirror. In one embodiment of the proposed laser sensor, a displacement unit is connected to the external mirror, which allows a controlled movement of this mirror for varying the cavity length of the external cavity. The displacement unit is preferably designed to periodically modulate the cavity length. With this modulation of the cavity length, the central wavelength of the laser radiation emitted by the VECSEL is modulated. For example, the displacement unit may comprise an appropriate piezoelectric actuator on which the external mirror is mounted. Other types of displacement units or actuators can also be used.

The construction of a VECSEL also allows the arrangement of a wavelength scanning or wavelength tuning element between the external mirror and the gain medium. Preferred examples of such wavelength tuning units are a Fabry-Perot interferometer or an etalon. The Fabry-Perot interferometer comprises a suitable actuator for modulating the distance between its two components. The etalon is driven by an appropriate actuator which rotates the etalon between different orientations or angles for wavelength scanning or wavelength tuning of the VECSEL.

In a further embodiment, the control unit controls an appropriate power source to modulate the operating current of the VECSEL for modulating the laser wavelength. This control unit can be designed, for example, to allow operation of the laser with a sawtooth or triangular operating current. The refractive index of the gain medium changes with the current, resulting in a change of the effective optical length of the laser cavity. This allows a wavelength tuning of the laser radiation via the injected current.

In a further embodiment of the proposed laser sensor, several VECSELs are arranged side by side in a one or two-dimensional array. Each VECSEL is designed in the same manner and has a corresponding photodetector for sensing the laser output. By coherently coupling the VECSELs in such an array by means of a suitable feedback mechanism, higher laser powers for sensing or measuring can be achieved as compared with laser sensors with only a single VECSEL.

In a preferred embodiment, the external mirrors of the VECSELs of such an array are designed to deflect a portion of the laser radiation so as to pass through the gain medium of one or several of the adjacent VECSELs. This can be achieved by an appropriately shaped external mirror. In a further embodiment, one or several additional deflecting elements are arranged between the external mirror and the gain medium of each VECSEL so as to achieve the coherent coupling in the same manner.

These and other aspects of the invention are apparent from and will be elucidated with reference to the embodiments described hereinafter.

BRIEF DESCRIPTION OF THE DRAWINGS

The proposed laser sensor will be described hereinafter by way of example with reference to the accompanying drawings without limiting the scope of protection as defined in the claims. In the drawings.

DESCRIPTION OF EMBODIMENTS

In the following examples of the proposed laser sensor, the VECSEL consists of a VCSEL layer structure 15 formed by an electrically pumped gain medium 3 (InGaAs quantum wells embedded in GaAs) embedded between two Distributed Bragg Reflectors (DBR) 2, 4, which form an inner cavity of the laser. The lower DBR 4 is highly reflective (reflectivity preferably >99.5%) for the lasing wavelength, while the upper DBR 2 has a smaller reflectivity in order to allow feedback from the external cavity. One of the DBRs is p-doped and the other n-doped so as to allow efficient current feeding into the gain region. In this example, the lower DBR 4 with the higher reflectivity is p-doped and the upper DBR 2 is n-doped. Principally, however, doping in the reversed order is also possible.

Figure 1:
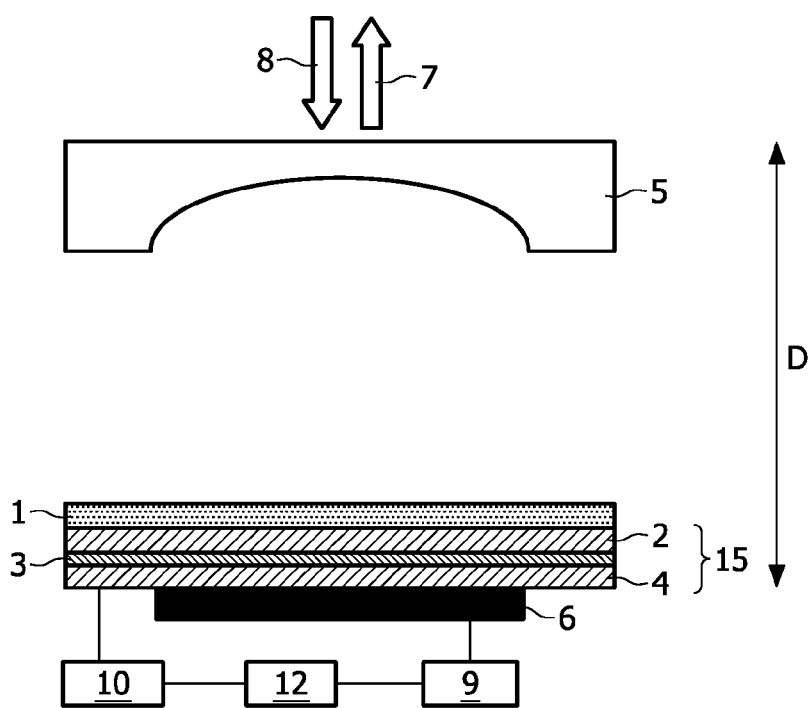
FIG. 1 is a schematic view of a first embodiment of the proposed laser sensor.
Figure 2:
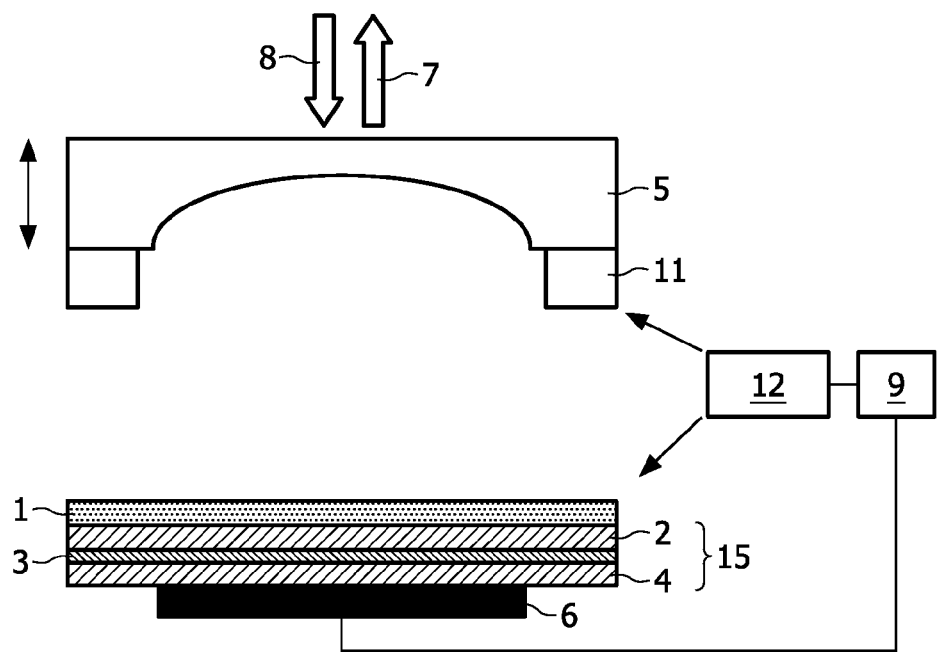
FIG. 2 is a schematic view of a second embodiment of the proposed laser sensor.
Figure 3:
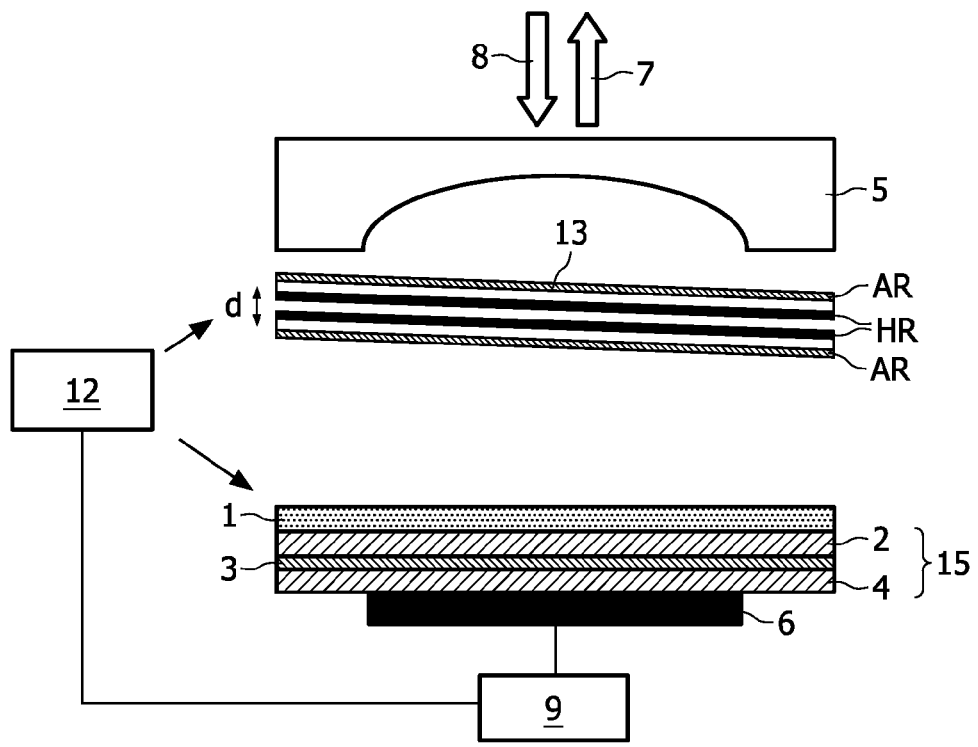
FIG. 3 is a schematic view of a third embodiment of the proposed laser sensor.
Figure 4:
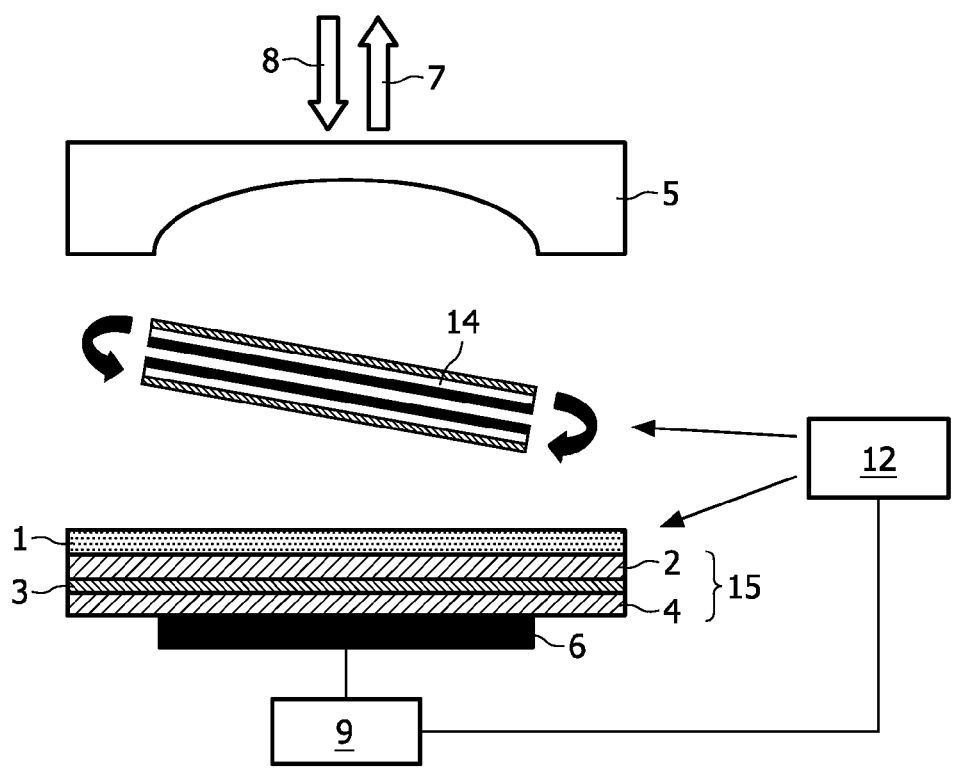
FIG. 4 is a schematic view of a fourth embodiment of the proposed laser sensor.

The operating current for current injection into the gain medium 3 is provided by an appropriate power source 10 which, in the embodiment of the proposed laser sensor of FIG. 1, is connected to a sensor control unit 12 or includes such a control unit 12 for timely modulating the injection current. A frequency shift of the emitted laser radiation 7 for obtaining the desired distance or velocity information is achieved with this current modulation. The variation of injected charge carriers results in a variation of the refractive index of the gain medium 3 and thus also in a variation of the optical cavity length D. The center wavelength $\lambda_c$ of a longitudinal cavity mode is given by $$\lambda_c = \frac{2 \cdot D}{m},$$

wherein m is the order of the respective mode. An increase of the optical cavity length thus also increases the emission wavelength of a given longitudinal mode. Typical wavelength shifts of about $\Delta\lambda_c \approx 0.5$ nm can be realized. If necessary, this range can be considerably extended by introducing other measures as shown in FIGS. 2 to 4.

In the embodiment shown in FIG. 1, a suitable current shape is fed into the gain region via the n and p-DBR electric contacts (not shown in the Figure). A photodetector 6 attached to the rear side of the lower DBR 4 measures the small amount of radiation leaking from the highly reflective p-DBR mirror 4 and thus monitors the influence of the back-scattered light 8 from the target object (not shown in the Figures) on the laser, from which information on the distance or velocity of the target object can be extracted. The VCSEL layer structure 15 is grown on an appropriate optically transparent substrate 1. Such a layer structure on this substrate can be produced in a low-cost production process for VCSEL chips. The photodetector 6 is therefore attached to the rear side of such a chip.

The external cavity is formed by a laser mirror 5 placed and adjusted above the upper DBR 2 at a suitable distance as shown in FIG. 1. This laser mirror 5 can be formed, for example, by a metal or dielectric coated mirror or by a narrow-band Volume Bragg Grating (VBG) having appropriate IR reflection properties. The gain medium is electrically pumped at a level which does not allow the inner cavity system to exceed the laser threshold, but requires feedback of the external cavity, i.e. the external mirror 5, to achieve lasing. In this way, the properties of the emitted laser radiation 7 are determined by the external cavity rather than by the short inner cavity on the VCSEL chip. Consequently, also the divergence angle of the emitted laser radiation 7 is decreased and the mode quality is enhanced as compared with a pure VCSEL-based sensor. The laser can thus be better focused on a target object, and the feedback 8 (back-scattered radiation from the target object) into the laser cavity, which is required for the sensing application, is improved.

There is one important difference between VCSEL and VECSEL-based SMI sensors. In a VCSEL-based laser sensor with its small cavity length, the free spectral range is usually larger than the bandwidth of the semiconductor gain medium. Hence, only one longitudinal cavity mode with a large line width is emitted. This is not the case anymore in a VECSEL with external cavity dimensions of the order of around 1 cm. Here, a multitude of longitudinal cavity modes is generated. Nevertheless, the sensor principle still works, as basically the laser frequency difference at the moment of emission and back-reflection is evaluated. However, the frequency shift is the same for all longitudinal modes, adding up to an accumulated signal. Mode hopping during frequency scanning is therefore also tolerable if it only affects a small number of longitudinal modes.

The back-scattered laser radiation 8 from the target object influences the wavelength of the emitted laser radiation 7 which is sensed by the photodetector 6. In order to evaluate this measurement signal, the photodetector 6 is connected to an appropriate evaluation unit 9 which communicates with the sensor control unit 12 and calculates the desired velocity or distance of the target object based on this frequency change.

In the case of a constant operating current and if the object of interest is moving at a constant velocity v in the direction of the axis of the laser, the back-scattered light from the object has a small frequency difference $\Delta f$ from the original frequency, referred to as the Doppler shift (c is the velocity of light)

$$\Delta f = \frac{2 \cdot v}{\lambda} = 2 \cdot f \cdot \frac{v}{c}$$

If this back-scattered light mixes with the light inside the laser cavity, a beat frequency proportional to $\Delta f$ is observed by the sensor on the power output of the laser diode. This method is applied to measure the velocity of objects because the beat frequency is proportional to the velocity v.

In the case of a modulated operating current, the distance of non-moving objects can also be detected: as described hereinbefore, the changing current leads to a changing frequency $f_2 = f_1 + \alpha \cdot \tau$ with $\alpha$ being the frequency change per time (can be made linear by selecting a proper operation regime). In this situation, the frequency of the back-scattered light differs from the actual frequency in the cavity by $$\Delta f \approx \alpha \cdot \tau \approx \alpha \cdot 2 \cdot \frac{d}{c}$$

wherein $\tau$ is the roundtrip time and therefore proportional to the traveling distance d. Again a beat frequency in the output power is observed, now proportional to the distance of the object.

FIG. 2 shows a second embodiment of the proposed laser sensor which allows a considerably extended wavelength shift of the VECSEL. In comparison with the embodiment shown in FIG. 1, this laser sensor allows a geometrical movement of the external laser mirror 5 in the directions indicated by the black arrows. This external laser mirror 5 is mounted on a piezoactuator 11 which is controlled by the sensor control unit 12 of the sensor. With this piezoactuator 11, the external mirror 5 can be moved in order to modulate the optical resonator length of the VECSEL.

The wavelength shift $\Delta\lambda_c$ for a geometrical movement $\Delta D$ can easily be calculated:

$$\Delta\lambda_c = \frac{2}{m} \cdot \Delta D$$

Taking into consideration the dependence of the center wavelength $\lambda_c$ from the order m of the longitudinal cavity mode and the cavity length D, the longitudinal mode order m of a VECSEL-based SMI sensor can be calculated. A typical mode order of m≈20000 follows from typical values of a VECSEL, for example, $\lambda_c \approx 1$ μm and D≈1 cm. For a required wavelength scan of $\Delta\lambda_c \approx 0.5$ nm, a displacement of $\Delta D \approx 5$ μm of the external mirror 5 is thus necessary, which can easily be achieved. Larger scanning ranges are therefore also easily accessible. Only the mass of the external cavity mirror 5, which must be moved for scanning, may limit the scanning frequency. As an equivalent solution, the VCSEL chip can be mounted on a piezoactuator and moved, while the external mirror 5 is kept fixed.

FIG. 3 shows a further embodiment in which wavelength scanning is achieved via a Fabry-Perot interferometer 13. This Fabry-Perot interferometer 13 is arranged between the external laser mirror 5 and the VCSEL layer structure 15. In this embodiment, the emission wavelength of the laser radiation 7 is controlled via the distance d between the two highly reflecting surfaces (HR) of two optically transparent parallel plates of the Fabry-Perot interferometer 13. One of these plates may be fixed while the other is mounted on a piezoelement (not shown in the Figure). The distance between the two plates is controlled or scanned via appropriate electronics which communicate with the sensor control unit. In order to avoid direct back-reflection of laser radiation by the highly reflecting surfaces into the gain region and thus unwanted lasing of the device without the influence of the external mirror 5, the Fabry-Perot interferometer 13 is preferably rotated through a small angle so that the optical resonator axis is not perpendicular to the optical surfaces of the Fabry-Perot interferometer 13. For minimization of additional losses within the external cavity, the outer sides of the optically transparent plates may be equipped with an anti-reflection coating (AR).

A similar frequency selection and scanning functionality can be achieved with an etalon 14 placed within the external cavity in the embodiment shown in FIG. 4. Frequency scanning of the VECSEL is achieved by a controlled rotation of the etalon 14 as schematically indicated by the black arrows. This rotation or tilting of the etalon 14 can be achieved with an appropriate actuator for the etalon, which can be controlled via the sensor control unit (not shown in the Figure).

As is already evident from the Figures described above, identical reference numerals indicate identical components of the laser sensor in the different Figures. These identical components will therefore only be explained with respect to one of the Figures. However, the explanations apply to all of the Figures.

Figure 5:
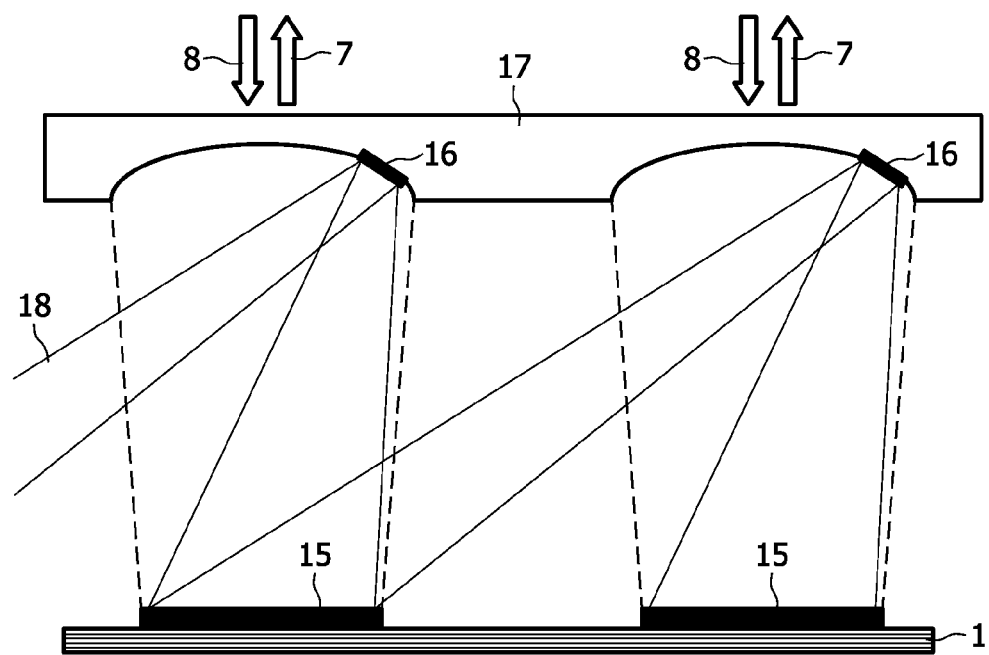
FIG. 5 is a schematic view showing a portion of a fifth embodiment of the proposed laser sensor.

For some applications, it may be necessary or at least beneficial to increase the output laser power of the sensor. An increased output laser power covers a wider application range of the laser sensor. This increased output laser power can be achieved by using VECSEL arrays in which the single elements are coherently coupled to a high-power laser. The coupling between the single devices can be realized, for example, by deflecting a small amount of the laser radiation of a VECSEL into the external cavity of one or several adjacent VECSELs, so that this deflected portion passes through the gain medium of the one or several adjacent VECSELs, while the main part of the light remains inside the cavity. The coupling of a small amount of light into neighboring laser diodes can be controlled, for example, by a specially shaped portion of the external laser mirror 5 as shown in the embodiment depicted in FIG. 5. FIG. 5 only shows a portion of such a laser sensor with two adjacent VECSELs. The VCSEL layer structures 15 are arranged on a common carrier or substrate 1. As can be seen from the Figure, a specially shaped portion 16 of the external mirrors 5 is designed in such a way that a small amount of light 18 which falls on the entire laser mirror 5 is directed onto the surface of one of the neighboring VCSEL layer structures 15. The directions of the reflection of the specially shaped portions 16, hereinafter also referred to as small coupling mirrors, are chosen in such a way that all elements of the VECSEL array are coupled together and emit laser light, which is coherent among all devices.

For the sake of simple manufacture/assembly, the laser mirrors 5 can be formed from a laser mirror array 17 as shown in FIG. 5.

Figure 6:
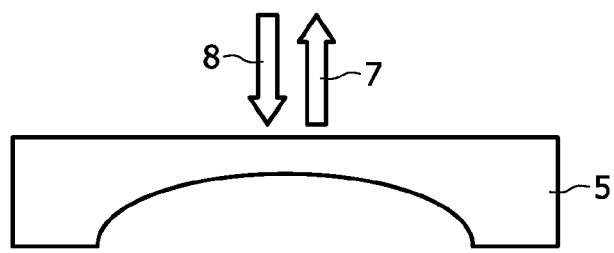
FIG. 6 is a schematic view of a sixth embodiment of the proposed laser sensor.
Figure 6:
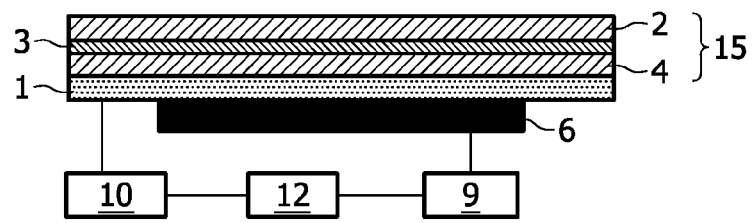

FIG. 6 shows a further embodiment of the proposed laser sensor which has a construction similar to that of the laser sensor of FIG. 1. The laser sensor of FIG. 6 only differs from the laser sensor of FIG. 1 in the arrangement of the optically transparent substrate 1 on which the VCSEL layer structure 15 is grown. In the embodiment shown in FIG. 6, this substrate 1 is arranged outside the extended cavity between the lower DBR 4 and the photodetector 6. In another embodiment, with the substrate 1 outside the extended cavity, the photodetector 6 may be arranged between the lower DBR 4 and the substrate 1. In the latter case, the substrate 1 may also be opaque.

The proposed laser sensor is suitable for all sensing applications of measuring distances, velocities or vibrations by using self-mixing interferometry. Examples of such applications are motion detection, position detection and velocity sensors, for example, in automotive applications, in homeland security or in man-machine interface pointing devices.

The invention has been illustrated and described in detail in the drawings and the foregoing description. However, the invention is not limited to the disclosed embodiments. The different embodiments described above and in the claims can also be combined. Other variations of the disclosed embodiments can be understood and effected by those skilled in the art in practicing the claimed invention, from a study of the drawings, the disclosure and the appended claims. For example, it is also possible to form more than one small coupling mirror per laser mirror, which couple the radiation of the assigned VECSEL diode to several neighboring diodes. Furthermore, in the VECSEL shown in the Figures, the upper DBR having the lower reflectivity may also be omitted.

In the claims, use of the verb "comprise" and its conjugations does not exclude other elements or steps, and the indefinite article "a" or "an" does not exclude a plurality. The mere fact that measures are recited in mutually different dependent claims does not indicate that a combination of these measures cannot be used to advantage. Any reference signs in the claims should not be construed as limiting the scope of these claims.

LIST OF REFERENCE NUMERALS 1 substrate
2 upper DBR
3 gain medium
4 lower DBR
5 external mirror
6 photodetector
7 emitted laser radiation
8 back-scattered laser radiation
9 evaluation unit
10 power source
11 piezoactuator
12 sensor control unit
13 Fabry-Perot interferometer
14 etalon
15 VCSEL layer structure
16 shaped portion of laser mirror
17 laser mirror array
18 deflected portion of laser light

The invention claimed is:
1. A self-mixing interferometric laser sensor comprising:
at least one semiconductor laser light source emitting laser radiation, the laser light source being a vertical external cavity surface emission laser comprising a first end mirror having a front side and a back side, a gain medium arranged in a layer structure on the front side of said first end mirror, the front side of said first end mirror forming an external cavity with an external second end mirror;
and at least one photodetector located on the back side of said front end mirror for measuring changes in properties of subsequent emitted laser radiation; and
wherein several vertical external cavity surface emission lasers with corresponding photodetectors are arranged side by side and form a one or two-dimensional array, said vertical external cavity surface emission lasers being coherently coupled.

2. A laser sensor according to claim 1, wherein the gain medium is sandwiched between two distributed Bragg reflectors in the layer structure, an outer one of said distributed Bragg reflectors having a higher reflectance for a lasing wavelength than an inner distributed Bragg reflector and forming the first end mirror of said external cavity.

3. A laser sensor according to claim 2, wherein the layer structure is formed on an optically transparent substrate inside said external cavity.

4. A laser sensor according to claim 2, wherein the layer structure is formed on a substrate outside said external cavity.

5. A laser sensor according to claim 1, further comprising a control unit for modulating in time an operating current of the vertical external cavity surface emission laser and to allow operation of the laser with a sawtooth or triangular operating current.

6. A laser sensor according to claim 1, wherein the external mirror or the layer structure including the first end mirror is mounted on a displacement unit, said displacement unit being controlled by a control unit so as to move said external mirror or said first end mirror for modulating an optical cavity length of the external cavity in time.

7. A laser sensor according to claim 1, wherein a wavelength tuning unit is arranged between the external mirror and the gain medium, said wavelength tuning unit being controlled by a control unit for modulating in time a central wavelength of the laser radiation emitted by the vertical external cavity surface emission laser.

8. A laser sensor according to claim 7, wherein the wavelength tuning unit comprises a Fabry-Perot interferometer driven by an actuator.

9. A laser sensor according to claim 7, wherein the wavelength tuning unit comprises an etalon which is tiltable or rotatable by an actuator.

10. A laser sensor according to claim 1, wherein the external mirror (5) of at least one of the several vertical external cavity surface emission lasers comprises a small coupling mirror for deflecting a portion of the laser radiation resonating in the external cavity so as to cause it to pass through the gain medium (3) of one or several adjacent vertical external cavity surface emission lasers.

11. A self-mixing interferometric laser sensor comprising:
at least one semiconductor laser light source emitting laser radiation, the laser light source being a vertical external cavity surface emission laser comprising a first end mirror having a front side and a back side, a gain medium arranged in a layer structure on the front side of said first end mirror, the front side of said first end mirror forming an external cavity with an external second end mirror; and
at least one photodetector, located on the back side of said front end mirror, for measuring affected subsequent radiation wherein the photodetector is connected to an evaluation unit, said evaluation unit being designed to calculate a distance and/or a velocity associated with the target from measurement signals of the photodetector; and
wherein several vertical external cavity surface emission lasers with corresponding photodetectors are arranged side by side and form a one or two-dimensional array, said vertical external cavity surface emission lasers being coherently coupled.

\* \* \* \* \*